United States Patent
Bailis et al.

(10) Patent No.: US 7,047,464 B2
(45) Date of Patent: May 16, 2006

(54) METHOD AND SYSTEM FOR USE OF A FIELD PROGRAMMABLE FUNCTION WITHIN AN APPLICATION SPECIFIC INTEGRATED CIRCUIT (ASIC) TO ACCESS INTERNAL SIGNALS FOR EXTERNAL OBSERVATION AND CONTROL

(75) Inventors: Robert Thomas Bailis, Cary, NC (US); Charles Edward Kuhlmann, Raleigh, NC (US); Charles Steven Lingafelt, Durham, NC (US); Ann Marie Rincon, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 10/016,448

(22) Filed: Dec. 10, 2001

(65) Prior Publication Data

US 2003/0110429 A1    Jun. 12, 2003

(51) Int. Cl.
*G01R 31/28* (2006.01)
*G06F 17/50* (2006.01)
(52) U.S. Cl. .......................... 714/725; 716/4
(58) Field of Classification Search ........ 714/724–727, 714/4; 716/4; 326/41
See application file for complete search history.

(56) References Cited

U.S. PATENT DOCUMENTS

| | | | | |
|---|---|---|---|---|
| 5,844,917 | A * | 12/1998 | Salem et al. ................ | 714/724 |
| 6,012,148 | A * | 1/2000 | Laberge et al. ............... | 714/2 |
| 6,134,173 | A | 10/2000 | Cliff et al. ............. | 265/230.03 |
| 6,173,419 | B1 | 1/2001 | Barnett ........................ | 714/28 |

(Continued)

OTHER PUBLICATIONS

"Boundary Scan Access of Built-in Self-test for Field Programmable Gate Arrays" by Gibson et al. Tenth Annual IEEE International Proceedings ASIC Conference and Exhibit Publication Date: Sep. 7-10, 1997, pp. 57-61, Inspec Accession No.: 5774208.*

(Continued)

*Primary Examiner*—Albert Decady
*Assistant Examiner*—Cynthia Britt
(74) *Attorney, Agent, or Firm*—Sawyer Law Group LLP

(57) ABSTRACT

An application specific integrated circuit (ASIC) is disclosed. The ASIC includes a standard cell. The standard cell includes a plurality of logic functions. The ASIC also includes at least one bus coupled to at least a portion of the logic functions and a plurality of internal signals from the plurality of logic functions. Finally, the ASIC includes a field programmable (FP) function coupled to the at least one bus and at least a portion of the plurality of internal signals. The FP function provides access to internal signals for observation and control. An ASIC using a field programmable gate array (FPGA) function within a standard cell design is utilized to create an internal-to-the-ASIC bridging of internal signals to observe and control of the internal signals of the ASIC. By the placement of logic, which expresses a test program, into the FPGA function that manipulates the I/O pins and/or other functional entities of interest, the ASIC function and/or surrounding logic can be easily verified. In addition, through this system, internal and/or system (external-to-the-ASIC) conditions can be observed. Furthermore, a sequence of resets to different functional blocks can be executed utilizing a system and method in accordance with the present invention. Finally, through this system the end user of the ASIC could write their own error condition correction FPGA code which would communicate using protocols of the existing system error condition architecture.

19 Claims, 9 Drawing Sheets

U.S. PATENT DOCUMENTS

| | | | |
|---|---|---|---|
| 6,178,541 B1 | 1/2001 | Joly et al. | 716/17 |
| 6,181,159 B1 | 1/2001 | Rangasayee | 326/39 |
| 6,182,206 B1 | 1/2001 | Baxter | 712/43 |
| 6,182,247 B1 | 1/2001 | Herrmann et al. | 714/39 |
| 6,191,614 B1 | 2/2001 | Schultz et al. | 326/41 |
| 6,209,118 B1 | 3/2001 | LaBerge | 716/1 |
| 6,211,697 B1 * | 4/2001 | Lien et al. | 326/41 |
| 6,219,819 B1 | 4/2001 | Vashi et al. | 716/3 |
| 6,219,833 B1 | 4/2001 | Solomon et al. | 717/5 |
| 6,223,148 B1 | 4/2001 | Stewart et al. | 703/25 |
| 6,223,313 B1 | 4/2001 | How et al. | 714/724 |
| 6,226,776 B1 | 5/2001 | Panchul et al. | 716/3 |
| 6,230,119 B1 | 5/2001 | Mitchell | 703/27 |
| 6,237,021 B1 | 5/2001 | Drummond | 709/201 |
| 6,247,147 B1 | 6/2001 | Beenstra et al. | 714/39 |
| 6,249,143 B1 | 6/2001 | Zaveri et al. | 326/40 |
| 6,252,422 B1 | 6/2001 | Patel et al. | 326/80 |
| 6,253,267 B1 | 6/2001 | Kim et al. | 710/103 |
| 6,256,296 B1 | 7/2001 | Ruziak et al. | 370/277 |
| 6,260,087 B1 * | 7/2001 | Chang | 710/100 |
| 6,260,182 B1 | 7/2001 | Mohan et al. | 716/12 |
| 6,260,185 B1 | 7/2001 | Sasaki et al. | 716/18 |
| 6,829,751 B1 * | 12/2004 | Shen et al. | 716/4 |

OTHER PUBLICATIONS

"pFSB Technology Enables Field Programmability in an ASIC Environment" by Coli et al. in Digest of Papers Compcon Spring '93, Publication Date: Feb. 22-26, 1993, pp.: 385-389 Inspec Accession No.: 4750288.*

C. E. Kuhlmann et al., Pending U.S. Appl. No. 10/016,346, "Field Programmable Network Processor and Method for Customizing a Network Processor".

R. T. Bailis et al., Pending U.S. Appl. No. 10/016,772, "Method and System for Use of an Embedded Field Programmable Gate Array Interconnect for Flexible I/O Connectivity".

R. T. Bailis et al., Pending U.S. Appl. No. 10/016,449, "Method and System for Use of a Field Programmable Gate Array Function within an Application Specific Integrated Circuit (ASIC) to Enable Creation of a Debugger Client within the ASIC".

R. T. Bailis et al., Pending U.S. Appl. No. 10/015,922, "Method and System for Use of a Field Programmable Interconnect within an ASIC for Configuring the ASIC".

R. T. Bailis et al., Pending U.S. Appl. No. 10/015,920, "Method and System for Use of a Field Programmable Function within a Chip to Enable Configurable I/O Signal Timing Characteristics".

R. T. Bailis et al., Pending U.S. Appl. No. 10/015,923, "Method and System for Use of a Field Programmable Function within a Standard Cell Chip for Repair of Logic Circuits".

R. T. Bailis et al., Pending U.S. Appl. No. 10/015,921, "Method and System for Use of a Field Programmable Gate Array (FPGA) Cell for Controlling Access to On-Chip Functions of a System on a Chip (SOC) Integrated Circuit".

* cited by examiner

METHOD AND SYSTEM FOR USE OF A FIELD PROGRAMMABLE FUNCTION WITHIN AN APPLICATION SPECIFIC INTEGRATED CIRCUIT (ASIC) TO ACCESS INTERNAL SIGNALS FOR EXTERNAL OBSERVATION AND CONTROL

CROSS-RELATED APPLICATIONS

The present application is related to the following listed seven applications: Ser. No. 10/016,346 entitled "Field Programmable Network Processor and Method for Customizing a Network Processor;" Ser. No. 10/016,772, entitled "Method and System for Use of an Embedded Field Programmable Gate Array Interconnect for Flexible I/O Connectivity;" Ser. No. 10/016,449, entitled "Method and System for Use of a Field Programmable Gate Array (FPGA) Function Within an Application Specific Integrated Circuit (ASIC) to Enable Creation of a Debugger Client Within the ASIC;" Ser. No. 10/015,922, entitled "Method and System for Use of a Field Programmable Interconnect Within an ASIC for Configuring the ASIC;" Ser. No. 10/015,920, entitled "Method and System for Use of a Field Programmable Function Within a Chip to Enable Configurable I/O Signal Timing Characteristics;" Ser. No. 10/015,923, entitled "Method and System for Use of a Field Programmable Function Within a Standard Cell Chip for Repair of Logic Circuits;" and Ser. No. 10/015,921, entitled "Method and System for Use of a Field Programmable Gate Array 9FPGA) Cell for Controlling Access to On-Chip Functions of a System on a Chip (S)C) Integrated Circuit;" assigned to the assignee of the present application, and filed on the same date.

FIELD OF THE INVENTION

The present invention relates generally to an application specific integrated circuit (ASIC) and specifically to providing an FPGA function to allow for access to internal signals for external observation and control.

BACKGROUND OF THE INVENTION

In today's test environment, application specific integrated circuits (ASICs) are extremely dense with various functions while having a limited number of I/O pins with respect to those functions. Often, there are significant, complex functions connected with only internal ASIC buses and signal paths, which are not exposed via an I/O pin. Further, due to the density and complexity of functions, it would not be practical to bring out all needed functions for observation and control, as this would result in potentially thousands of I/O pins.

The observation and control include testing functions within the ASIC. In today's (logical) ASIC test environment, ASICs and the system that contains the ASICs are verified to be functional using a variety of methods, including:

Scan chain testing (a string of values associated with specific input pins are serially loaded into the ASIC so as to present themselves at the input pins, then the ASIC executes a clock cycle, then the values of output pins are clocked out of the ASIC and the values verified to be as expected, then the process is repeated).

External ASIC testers, which connect to and manipulate the I/O pins.

Internal to the ASIC, "hard coded" routines.

Manufacturing test programs run on either processors within the system under test or on special test driver systems.

In addition, it is desirable to observe and control internal system errors in an ASIC. Internal system errors, such as parity errors, bus arbitration errors, errant code pointers, improper memory accesses (to restricted or nonexistent locations) and certain types of software errors have traditionally resulted in a lock-up condition in the system. When this occurs, several options exist:

A software or hardware reset of the system by an external entity, from which a catastrophic error recovery process can be executed (assuming the processor is still capable of running at this level).

A secondary "error service processor" observes the error condition and recovers the system. In some cases, it may be possible to reset only the portion of the system that experiences the error; thus, potentially saving current data or speeding up the error recovery process.

Historically, functional entities were embodied in multiple modules with an exposed bus and signal paths between the modules. This enables the use of logical analyzers, logic debuggers and like tools to be used to observe and control the system. With the advent of integration techniques, multiple modules and their interconnections are now placed inside a single chip, often an ASIC. Because of this integration, the use of these tools (external logical analyzers, logic debuggers and like tools) is not possible with today's ASICs, as there is no physical method available to place the tools on an internal-to-the-ASIC bus and no method to disconnect and tie up or down internal-to-the-ASIC signal paths to provide the observation and control of the functions.

Accordingly, what is needed is a system and method for allowing the observation and control of an ASIC that allows for placing tools internal to the ASIC without requiring additional I/O pins. The system should be easy to implement, cost effective and easily adaptable to standard cell IC design tool. The present invention addresses such a need.

SUMMARY OF THE INVENTION

An application specific integrated circuit (ASIC) is disclosed. The ASIC includes a standard cell. The standard cell includes a plurality of logic functions. The ASIC also includes at least one bus coupled to at least a portion of the logic functions and a plurality of internal signals from the plurality of logic functions. Finally, the ASIC includes a field programmable (FP) function coupled to the at least one bus and at least a portion of the plurality of internal signals. The FP function provides access to internal signals for observation and control.

An ASIC using a field programmable gate array (FPGA) function within a standard cell design is utilized to create an internal-to-the-ASIC bridging of internal signals to observe and control of the internal signals of the ASIC. By the placement of logic, which expresses a test program, into the FPGA function that manipulates the I/O pins and/or other functional entities of interest, the ASIC function and/or surrounding logic can be easily verified. In addition, through this system, internal and/or system (external-to-the-ASIC) conditions can be observed. Furthermore, a sequence of resets to different functional blocks can be executed utilizing a system and method in accordance with the present invention. Finally, through this system the end user of the ASIC could write their own error condition correction FPGA code which would communicate using protocols of the existing system error condition architecture.

DETAILED DESCRIPTION

The present invention relates generally to an application specific integrated circuit (ASIC) and specifically to providing an FPGA function to allow for the debug via the ASIC. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
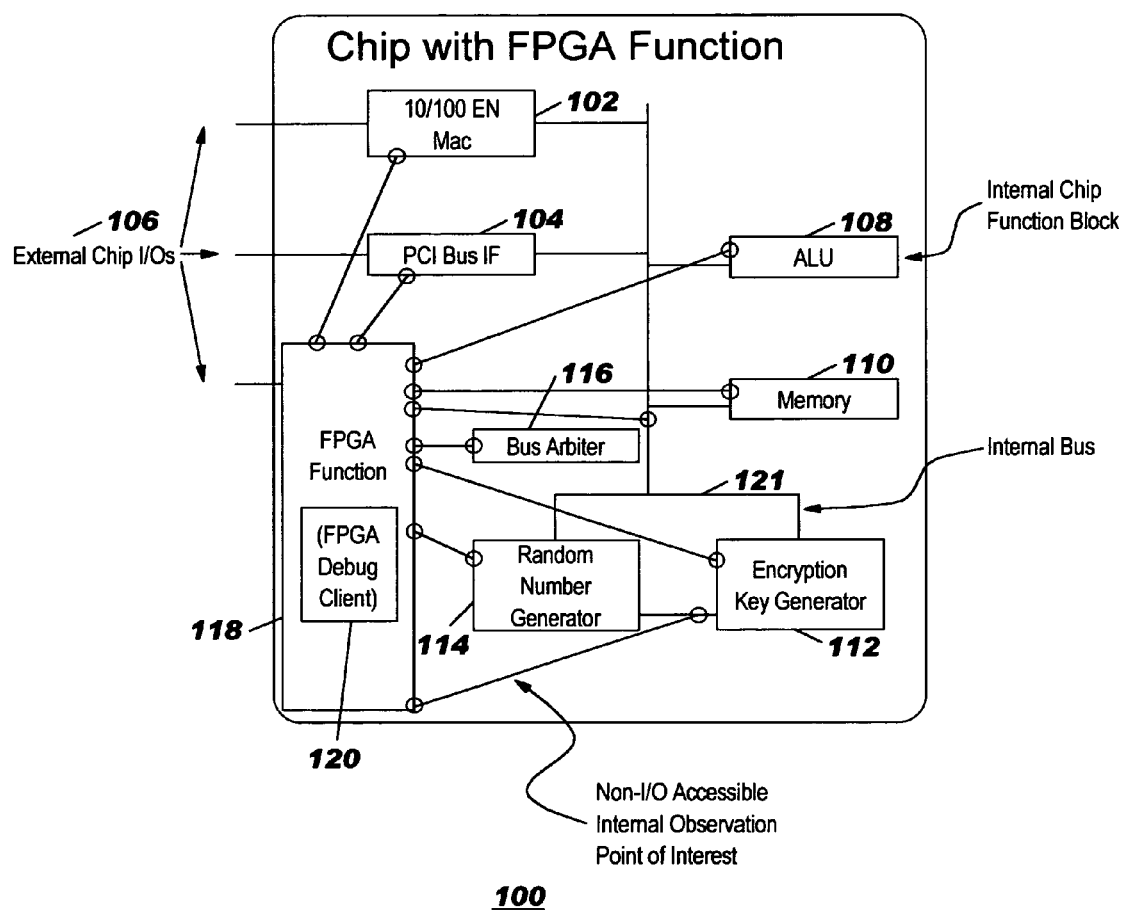
FIG. 1 illustrates the placement of an FPGA function into a representative standard cell design.

FIG. 1 illustrates the placement of a FPGA function into a representative standard cell design 100. In this embodiment, the standard cell design includes a media access controller (MAC) 102, a PCI bus interface 104, arithmetic logic unit (ALU) 108, a memory 110, a bus arbiter 116, a random number generator 114, and encryption key generator 112. A plurality of external I/Os 106 are provided to the MAC 102, the PCI bus interface 104 and to the FPGA function 118. In addition, there is an internal bus 121 between the generator 114 and the generator 112. An FPGA signal connector function 120 is within the FPGA function 118. Although specific functions and buses are illustrated in the standard cell, one of ordinary skill in the art recognizes that a variety of functions could be utilized and that use would be within the spirit and scope of the present invention.

As is seen, all internal buses and signals of interest are "bused" or connected to the FPGA function 118. In the preferred embodiment, the FPGA function 118 itself has external I/O connectivity. An alternative embodiment would be to reuse an existing I/O structure, such as a PCI bus, but this has inherent disadvantages when trying to observe and control a function that also uses that I/O structure. As has been described above, the FPGA function 118 includes a signal connector function 120 thereafter. The signal connector function 120 can be utilized advantageously to observe and manipulate the buses and internal signals of the standard cell. For a further description of the features of the signal connector function 120, refer now to the following description in conjunction with the accompanying figures.

Observation and Control

Figure 2:
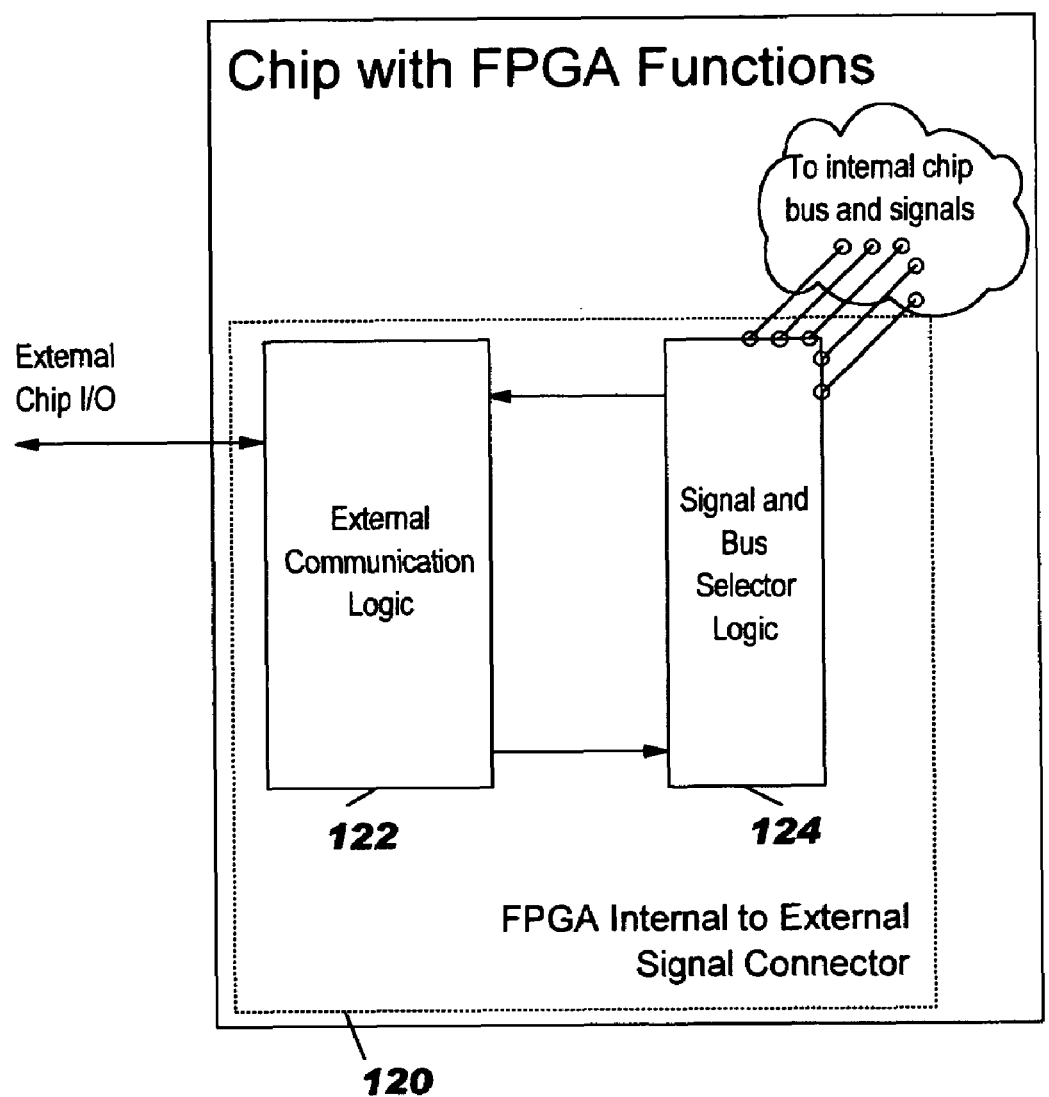
FIG. 2 illustrates a logical view of the internals of the debug client function in accordance with the present invention.

FIG. 2 illustrates a logical view of the internals of the FPGA signal connector function 120 in accordance with the present invention. FIG. 2 is not meant to illustrate how one would physically program this area. The signal connector function 120 includes an external communication logic function 122 which receives the external I/Os and is in communication with a signal and bus selector logic function 130. The selector logic function 130 is in turn coupled to the internal bus and the internal signals. The function and features of each of the logic elements of the signal connector logic 120 are described below.

External Communication Logic Function 122

The external communication logic function 122 provides the external I/O function for the communication with devices outside the ASIC. The external communication logic function 122 provides the external I/O function 122 and may provide buffering and/or multiplexing of internal buses and/or serialization of the internal information onto a smaller number of I/O pins.

Signal and Bus Selector Logic Function 124

The signal and bus selector logic function 124 can be embodied either as physical bus selectors gates using standard bus selector techniques in which all signals are sent through this selector logic 124 and the FPGA logic then selects the signals of interest or as a virtual selection (all signals of interest are available at a particular input point, tied up or down as appropriate, but only those points of interest are connected to and enabled when the FPGA function 118 is programmed—defacto selection).

Figure 3:
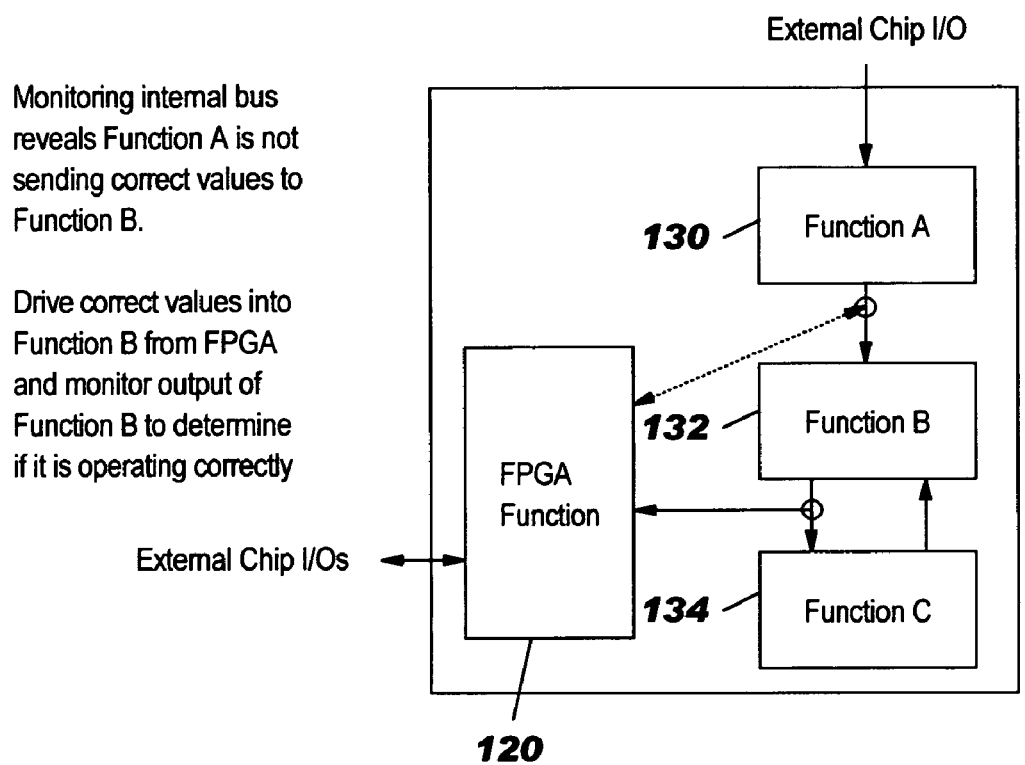
FIG. 3 illustrates utilizing the FPGA logic to drive values onto internal points of an ASIC to facilitate testing of an ASIC.

FIG. 3 illustrates utilizing the FPGA signal connector function 120 to drive values onto internal points of an ASIC to facilitate testing of an ASIC. The FPGA signal connector function 120 could be used to drive values into the ASIC to facilitate testing or debug in addition to being used to observe internal activity. This would be useful in the case when an error in one section of the ASIC (Function 130) prevents signals from being properly propagated to another section of the ASIC (Function 132). Because Function 132 never receives the correct stimuli, it is impossible to test the logic in Function 132 correctly. Signals coming from the External Communications Logic 122 (FIG. 2) configured in the signal connector function 120 logic could drive the correct signals directly into the Function 132 to see if it functions correctly.

Figure 4:
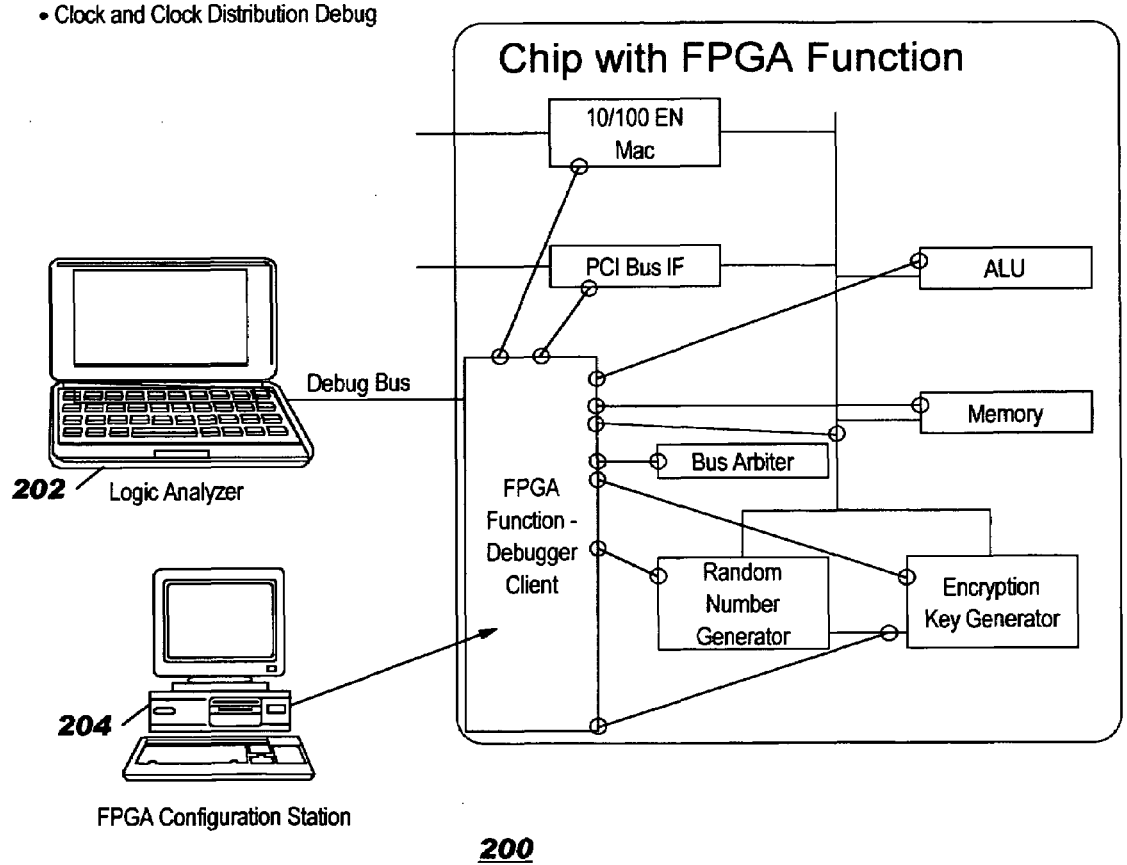
FIG. 4 illustrates a system that could be utilized with the ASIC that includes the FPGA function.

FIG. 4 illustrates a system 200 that could be utilized with the ASIC that includes the FPGA function. The system 200 includes a logic analyzer 202 that is coupled to the FPGA function via a debug bus and a configuration station 204 that programs the FPGA function 118. The selection of internal-to-the-ASIC signals of interest are made by the user either via a program on a PC at the configuration station 204, which, based on the user desires, creates, at the time of use, the FPGA "program" that "bridges" the signals of interest to the debug pins or by the appropriate selection of "canned" or predefined FPGA "programs". These canned programs could be supplied by the ASIC vendor, and would expose a set of internal debug points. For example, the ASIC vendor may supply five (5) FPGA loads for various common debug conditions such as:

1. Memory and Memory Bus Debug
2. MAC Bus Debug
3. PCI, Internal Bus and Bus Arbiter Debug
4. Processor Debug
5. Clock and Clock Distribution Debug As an extension to this feature, one could allow the interconnection of a function within the Signal and Bus Selector Logic function 124 (FIG. 2) such that internal ASIC inputs and outputs could be connected together within the FPGA function 120.

One of the primary advantages of the method and system in accordance with the present invention over providing a hard coded function within a standard ASIC, is that the user can change the signals/buses and in what format (multiplexed, serialized, high order bits dropped, etc.) these signals are presented on the I/O (debug) pins. This is not possible after the silicon is created. One can not always fully anticipate what all signals are needed and in what format to present the signals. By utilizing the FPGA function 120, this anticipation is not necessary. Further, the FPGA function 120 can be reloaded multiple times with different test routines to overcome the inherent size restriction of the FPGA function 120 (only so much "code" can be put in a given number of FPGA cells at any one time).

Testing Function

This programmability has further ramifications in that dependent on the use of a ASIC (some multipurpose ASICs can be used in quite different systems), the test cases may be programmed to specifically meet the needs of the user, which could not have been fully anticipated during ASIC development. Further, the testing requirements, especially of the system containing the ASIC, between different users may be incompatible. A "hard-coded" function in the ASIC could not satisfy both users of the same ASIC. This is especially true of the test routines, which verify functions that are dependent on customer configuration or system configuration. To further illustrate this feature, refer to the following.

Figure 5:
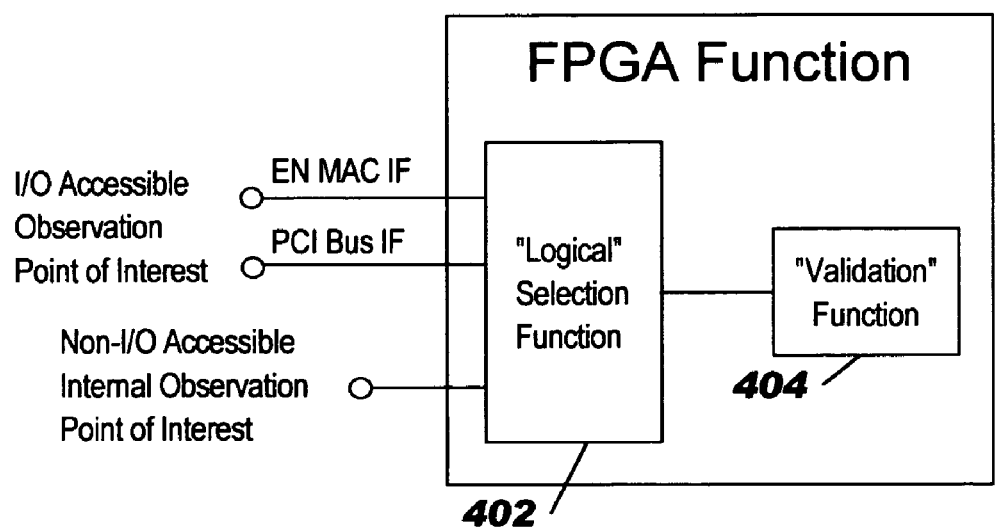
FIG. 5 illustrates a LOGICAL view of the internals of the FPGA area when using validation logic for testing purposes.

FIG. 5 illustrates a LOGICAL view of the internals of the FPGA function 118 when using a logical selector function 402 in conjunction with a validation logic 404 for testing purposes. A logical selector function 402 can be embodied either as physical bus selector gates using standard bus selector techniques in which all signals are sent through this selector logic and then selects the ones of interest or as virtual selection (all signals of interest are available at a particular input point, tied up or down as appropriate and with each verification test load, but only those points of interest are connected to and enabled—defacto selection). The validation logic 404 contains the test program function, which is further illustrated in FIG. 6.

Figure 6:
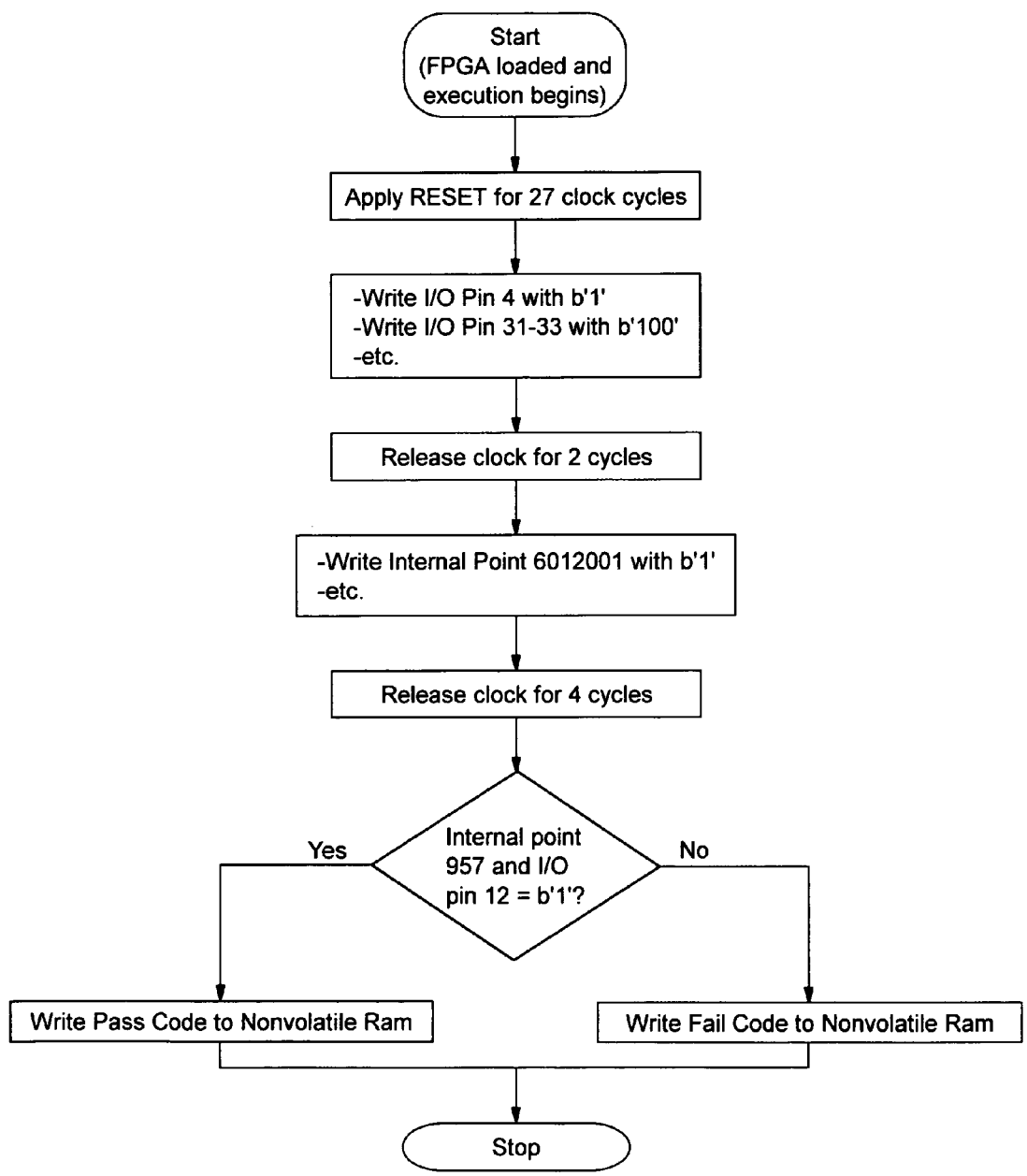
FIG. 6 illustrates a simple example test program that would be embodied in the FPGA logic.

FIG. 6 illustrates a simple example test program that would be embodied in the validation logic 402 of the FPGA function. Note that the actual embodiment of the illustrated logic is not dependent on a particular FPGA programming language or form. In addition, the actual programming test algorithm would be dependent on the functions tested. The test program in FIG. 6 is only to illustrate the concept. Note that the use of nonvolatile memory to hold the results of the test is not required. There are many ways of communicating with the user, such as illuminating an LED, placing a known value on an I/O pin, using communication protocols to send a message to another device, etc.

Figure 7:
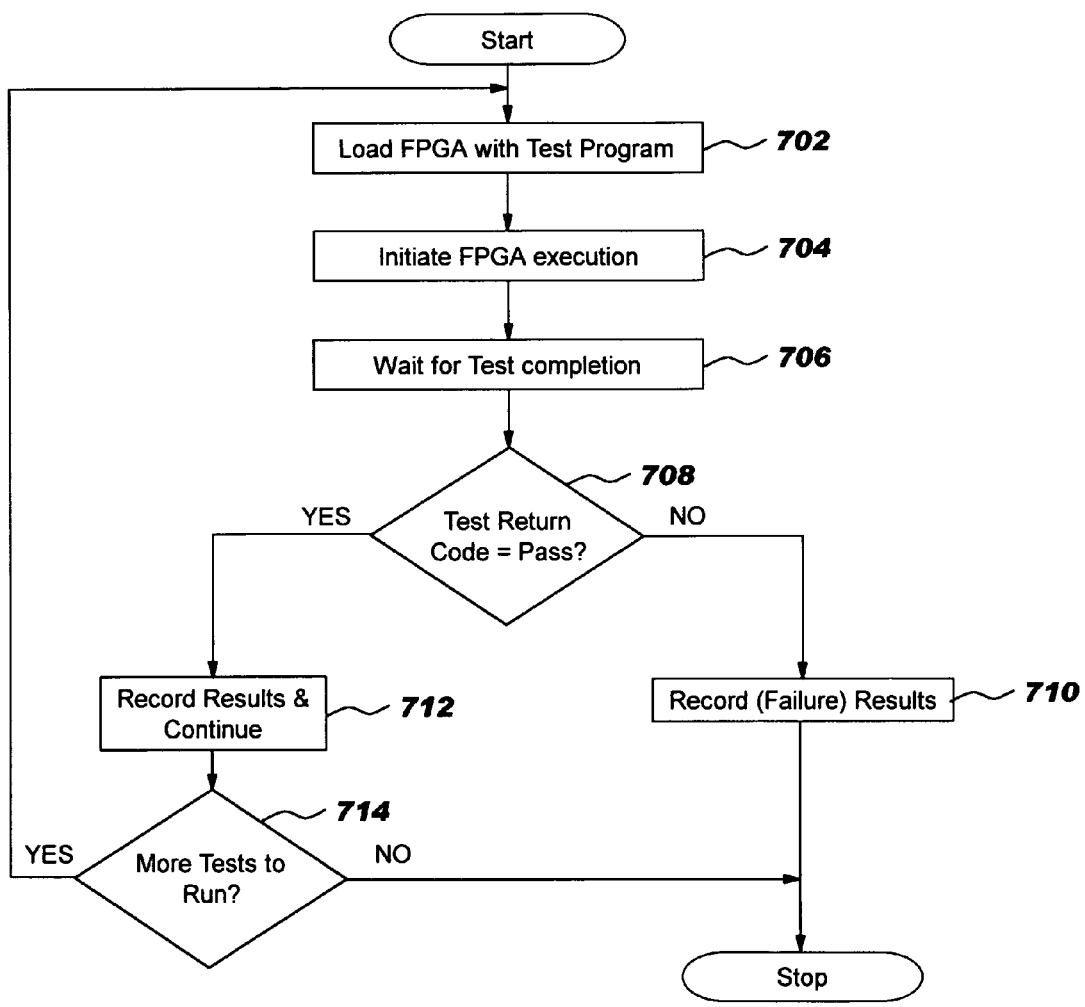
FIG. 7 illustrates a typical usage of an FPGA function in accordance with the present invention within a testing system.

FIG. 7 is a flow chart that illustrates the operation of a test program within the FPGA function. First, the test program is loaded with the FPGA function, via step 702. Next, the FPGA execution is initiated, via step 704. Thereafter, the test is completed, via step 706. Then it is determined if the test was passed, via step 708. If not, then the failure results are recorded, via step 710 and then stop. If the test is passed, the successful results are recorded, via step 712, and it is determined if there are more tests to run, via step 714. If there are more tests to run, then return to step 702, and if there are no more tests to run, then stop. In this example the loading of the FPGA enabled ASIC would be under control of a "ASIC system tester". After the loading and subsequent test execution, the "system tester" would obtain some indication with respect to the results of the test from the test program. This may be accomplished by the test program writing a test result code into a common storage media, such as a memory location or internal ASIC register.

A system and method in accordance with the present invention provides the following advantages. The method and system can do complex verification testing that requires multiple logical inputs to be presented simultaneously or in some specific order. The method and system can perform verification testing on functions in which no external I/O is available. The method and system can perform verification testing of the surrounding (off-ASIC) function 401. In some cases, the method and system may be faster than using scan ASIC test or other test processes. The cost of this method and system, compared with external ASIC tests, is substantially less. If multiple test programs are required, the FPGA program itself, using some nonvolatile storage to maintain test program state, could recursively load the additional test programs.

The advantage over "hard coded" test routines is that test routines can be created independently of the ASIC development processes, i.e., because "hard coded" test routines must be instantiated in the ASIC, they must be created and placed in the ASIC simultaneously with other ASIC logic. Thus the development of the routines must be simultaneous with the ASIC development. In addition, because the "hard coded" routines are fixed, the amount of test functionality is limited (can reload another test sequence into hard coded ASICs).

As compared to external-to-the-ASIC test methods, this method is cheaper, can test non-I/O accessible points of interest, and can be done in the field if needed (does not require attachment of an ASIC tester). The cost of modifying or adding another test is small compared to all other methods.

Another advantage of the method and system in accordance with the present invention over providing a hard coded portion of a standard ASIC is that the user can change the test process and change the test cases after the ASIC has been cast into silicon and after the ASIC has been placed in the system. This programmability has further ramifications in that dependent on the use of a the ASIC (some multipurpose ASICs can be used in quite different systems), the test cases may be programmed to specifically meet the needs of the user, which could not have been fully anticipated during ASIC development.

Error Recovery Function

In addition, an error recovery function can be placed in the FPGA portion of the ASIC that watches for errors and then takes appropriate action to recover the system. Following is a more thorough explanation of this feature.

Figure 8:
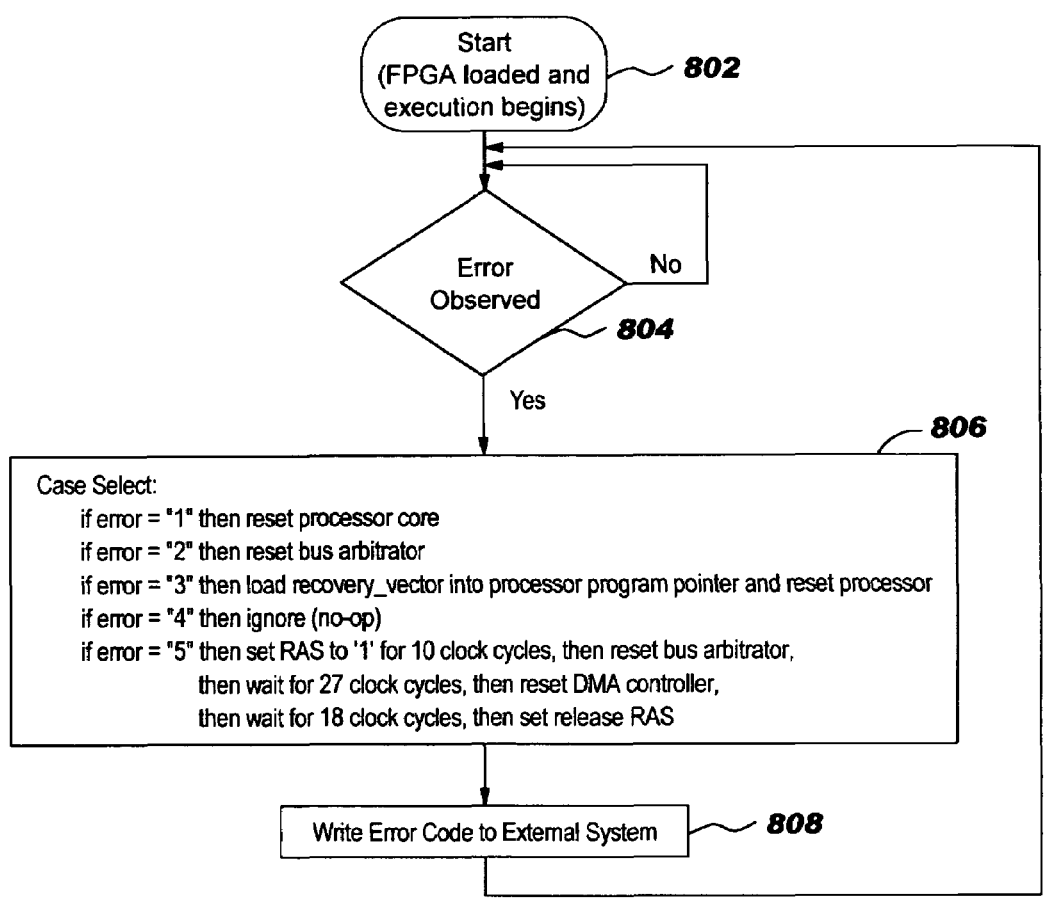
FIG. 8 illustrates an example logic flow, which monitors for error conditions and for error recovery.

FIG. 8 illustrates an example logic flow which monitors for error conditions, and upon finding one, performs the actions necessary to recover or to notify the appropriate entity of the error condition.

First, the error recovery FPGA function is loaded, via step 802. Next, it is determined if an error is observed, via step 804. If no error is observed, then return. If an error is observed, then the error case is determined and corrected, via step 806.

For example:

If error=1, then reset processor core.

If error=2, then reset bus arbitrator.

If error=3, then load recovery_vector into processor program pointer and reset processor.

If error=4, then ignore (no-op).

If error=5, then set RAS to 1 for 10 clock cycles, then reset bus arbitrator, then wait for 27 clock cycles, then resets DMA controller, then wait 18 clock cycles, then set release RAS.

Thereafter, the error code is written to an external system based upon the error case, via step 808.

Note that this is just a simplified example program. The program could be complex with multiple error conditions that are logically examined to determine an action or set of actions.

Figure 9:
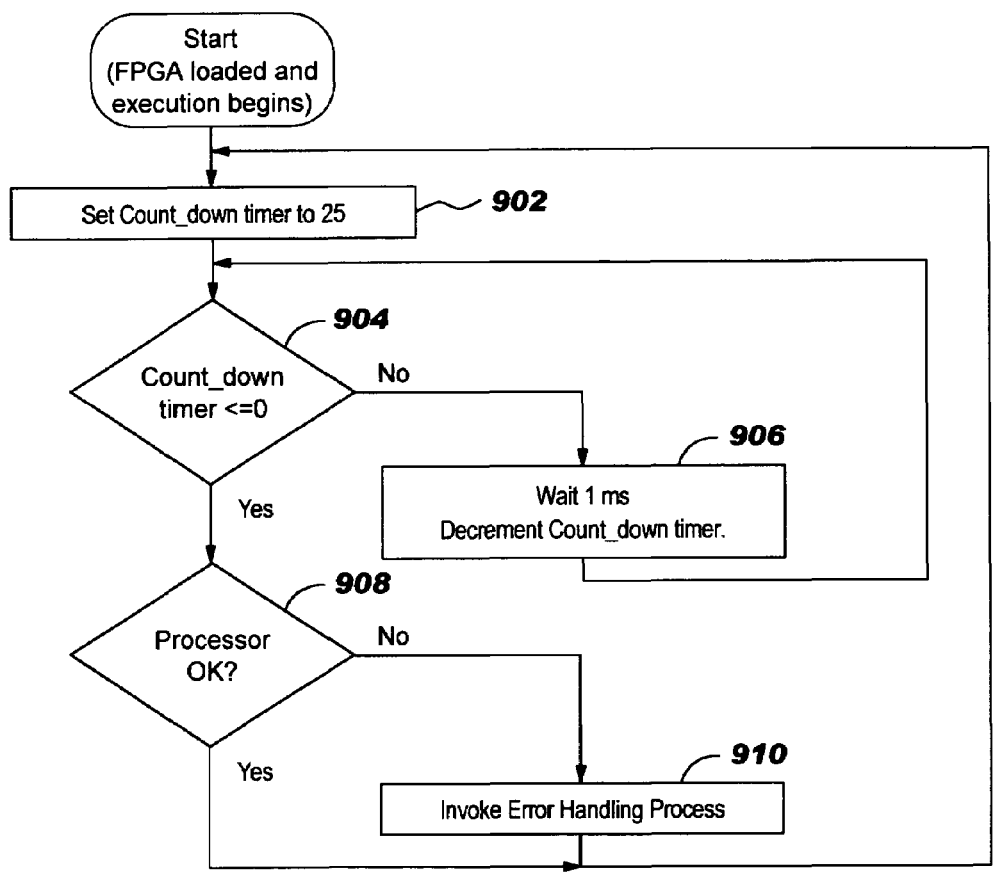
FIG. 9 is a simplified flow chart illustrating the operation of an error recovery sequence that utilizes a watchdog function.

As an extension to the base idea of observing and then performing an error recovery sequence, the FPGA program could embody a "watch-dog" function in which if a "heartbeat" or some other periodic indication of good health is not received, the error recovery processes would begin. This is illustrated in a simplified flow chart in FIG. 9.

FIG. 10 is a simplified flowchart illustrating the operation of an error recovery sequence that utilizes a watchdog function. First, a Count_down timer is set, via step 902. Next, it is determined if Count_down timer is at zero, via step 904.

If the timer is not at zero, then there is a predetermined waiting period (1 ms in this example), and the Count_down timer is decremented, via step 906 and return to step 904. If the timer is at zero, then it is determined if a portion of the ASIC (the processor) is okay, via step 908. If the processor is not okay, then an error-handling process is invoked, via step 912, and return to step 910. If the processor is okay, then return to step 904.

When the ASIC is used in different systems, the error recovery process, including the method of communicating (fitting within a system's or product line's error recovery architecture) and interaction within the system is difficult for each system. Because the FPGA is programmable, different customers can tailor the same ASIC to their different needs—either across a product line or with same ASIC in different product lines. In other words, the same ASIC, in different uses, can have different error recovery processes. This expressing of differences can not be done with standard cell ("hard-coded") routines.

The error observation and recovery function in the FPGA could be reprogrammed after the ASIC was manufactured and shipped, i.e., in the field. Thus, it was discovered that additional error recovery function was needed, perhaps because of a newly discovered system problem or a new software upgrade, this FPGA could be reprogrammed. This reprogramming can not be done with standard cell ("hard-coded") routines.

The error observation and recovery function is physically separate from the operational code. This simplifies both the development and structure of the operational code and the error recovery function. This improves development cycle time and increases the reliability of the system.

The separation of the operational code and the error observation and recovery function allows the parallel, independent development of the two functions. This decoupling of dependent efforts can result in better development cycle times.

Conclusion

An ASIC using FPGA function within a standard cell design is utilized to create an internal-to-the-ASIC bridging of internal signals to observe and control of the internal signals of the ASIC. By the placement of logic, which expresses a test program, into the FPGA function that manipulates the I/O pins and/or other functional entities of interest, the ASIC function and/or surrounding logic can be easily verified. In addition, through this system, internal and/or system (external-to-the-ASIC) conditions can be observed. Furthermore, a sequence of resets to different functional blocks can be executed utilizing a system and method in accordance with the present invention. Finally, through this system the end user of the ASIC could write their own error condition correction FPGA code which would communicate using protocols of the existing system error condition architecture.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An application specific integrated circuit (ASIC) comprising:
    a standard cell, the standard cell including a plurality of logic functions;
    at least one bus coupled to at least a portion of the logic functions;
    a plurality of internal signals from the plurality of logic functions; and
    a field programmable (FP) function coupled to the at least one bus and at least a portion of the plurality of internal signals, wherein the FP function provides access to internal signals for observation and control without utilizing input/output (I/O) pins to access the internal signals.

2. The ASIC of claim 1 wherein the FP function comprises a signal connector function.

3. The ASIC of claim 2 wherein the signal connector function comprises a first logic for providing an external I/O function and a second logic which is in communication with the first logic that selects the appropriate internal signals for external observation and control.

4. The ASIC of claim 1 wherein the FP function includes a testing function.

5. The ASIC of claim 4 wherein the testing function includes a selector function for selecting the signals of interest and a validation function coupled to the selector function for testing the signals of interest.

6. The ASIC of claim 5 wherein the testing function includes a test program for validating at least one of the plurality of logic functions.

7. The ASIC of claim 1 wherein the FP function includes an error recovery function.

8. The ASIC of claim 7 wherein the error recovery function comprises determining if an error is observed, determining the error case when an error is observed and corrected.

9. The ASIC of claim 8 wherein the error recovery function further includes writing an error code to an external system based upon the error case.

10. The ASIC of claim 8 wherein the error recovery function utilizes a watchdog function.

11. The ASIC of claim 9 wherein the watchdog function comprises determining after a predetermined time-period or number of actions if a portion of the ASIC is operating properly, and invoking an error-handling process if the portion is not operating properly.

12. The ASIC of claim 1 wherein the FP function comprises a field programmable gate array function.

13. A method for providing a testing function in an application specific integrated circuit (ASIC), the ASIC including a standard cell, the standard cell including a plurality of logic functions, the method comprising:

(a) providing a field programmable (FP) function in the ASIC for monitoring internal signal from the plurality of logic functions for observation and control without utilizing input/output (I/O) pins to access the internal signal; and (b) providing a test program in the FP function.

14. The method of claim 13 wherein the test program validates at least one of the plurality of logic functions.

15. A method for allowing an application specific integrated circuit (ASIC) to operate after an error has occurred therein, the ASIC including a standard cell, the standard cell including a plurality of logic functions, the method comprising:

(a) providing a field programmable (FP) function in the ASIC for monitoring internal signal from the plurality of logic functions for observation and control without utilizing input/output (I/O) pins to access the internal signal; and (b) providing an error recovery function within the FP function.

16. The method of claim 15 wherein the error recovery function comprises determining if an error is observed, determining the error case when an error is observed and corrected.

17. The method of claim 16 wherein the error recovery function further includes writing an error code to an external system based upon the error case.

18. The method of claim 16 wherein the error recovery function utilizes a watchdog function.

19. The method of claim 18 wherein the watchdog function comprises determining after a predetermined time-period or number of actions if a portion of the ASIC is operating properly, and invoking an error-handling process if the portion is not operating properly.

* * * * *